United States Patent [19]
Adachi et al.

[11] Patent Number: 6,074,479
[45] Date of Patent: Jun. 13, 2000

[54] SILICON SINGLE CRYSTAL WAFER ANNEALING METHOD AND EQUIPMENT, AND SILICON SINGLE CRYSTAL WAFER AND MANUFACTURING METHOD RELATED THERETO

[75] Inventors: Naoshi Adachi, Ogi-gun; Takehiro Hisatomi, Nishimatuura-gun; Masakazu Sano, Saga, all of Japan

[73] Assignee: Sumitomo Metal Industries Ltd., Hyogo, Japan

[21] Appl. No.: 09/327,383

[22] Filed: Jun. 8, 1999

Related U.S. Application Data

[63] Continuation of application No. 09/029,398, filed as application No. PCT/JP97/02232, Jun. 27, 1997, Pat. No. 5,931,662.

[30] Foreign Application Priority Data

Jun. 28, 1996 [JP] Japan ................................. 8-188214

[51] Int. Cl.⁷ ............................. F27D 5/00; B05C 13/00; C30B 35/00
[52] U.S. Cl. ....................... 117/204; 206/710; 206/711; 206/712; 206/832; 206/833; 211/41.18; 118/500; 118/724; 118/728; 432/253

[58] Field of Search .................... 206/710, 711, 206/712, 832, 833; 211/41.18; 432/253, 258, 259; 118/724, 728, 500; 117/204

[56] References Cited

U.S. PATENT DOCUMENTS

| | | | |
|---|---|---|---|
| 5,492,229 | 2/1996 | Tanaka et al. | 211/41.18 |
| 5,931,662 | 8/1999 | Adachi et al. | 432/6 |

FOREIGN PATENT DOCUMENTS 6302532  10/1994  Japan .

*Primary Examiner*—Benjamin Utech
*Assistant Examiner*—Donald L. Champagne
*Attorney, Agent, or Firm*—Breiner & Breiner

[57] ABSTRACT

This invention anneals a vertical stack of two or more groups of unseparated wafers, with approximately 10 wafers in each group. The invention makes it possible to anneal more wafers in a single annealing operation under a variety of conditions, including: oxygen outer diffusion annealing to form a denuded zone; annealing to control bulk micro defects and provide intrinsic gettering functions; annealing to enhance gate oxide integrity by eliminating crystal-originated particles from the wafer surface and internal grown-in or as-grown defects; and suppression of dislocation and slip in elevated temperature environments.

4 Claims, 18 Drawing Sheets

6,074,479

SILICON SINGLE CRYSTAL WAFER ANNEALING METHOD AND EQUIPMENT, AND SILICON SINGLE CRYSTAL WAFER AND MANUFACTURING METHOD RELATED THERETO

This is a continuation of application Ser. No. 09/029,398 filed Mar. 12, 1998, now issued as U.S. Pat. No. 5,931,662, which is the national stage entry of PCT JP97/02232, Jun. 27, 1997.

TECHNICAL FIELD

The present invention involves an annealing method as well as a manufacturing method whereby a large volume of silicon single crystal wafers are simultaneously and uniformly annealed, and is related to a silicon single crystal wafer annealing method as well as a manufacturing method that uses this annealing method, which enables annealing to be performed uniformly and effectively on large numbers of wafers processed simultaneously using a variety of annealing, to include, for instance, oxygen outward diffusion annealing for forming a denuded zone (DZ) layer, annealing that generates and controls oxygen precipitate-induced bulk micro defect (BMD) for the provision of intrinsic gettering (IG) functions, and annealing that endeavors to enhance device characteristics by eliminating grown-in defects, which give rise to surface crystal originated particles (COP) and internal COP, by stacking up approximately 10 wafers, for example, to form a group, and stacking this group of wafers up vertically with a plurality of wafer groups by inclining each group slightly from the horizontal, and subjecting them to the required annealing in the same furnace.

BACKGROUND ART

Silicon wafers used in MOS ULSI devices are almost all grown via Czochralski (CZ) crystal pulling method. Silicon single crystals grown via this CZ process ordinarily contain around $10^{18}$ atoms/cm$^3$ of oxygen impurities, and if used as-is in device fabrication processes, the supersaturated oxygen atoms precipitate during processing.

Further, the volume expansion of this oxygen precipitate causes secondary defects such as dislocations and stacking faults. These oxygen precipitates (BMD) and their secondary defects greatly impact the characteristics of a semiconductor device, and when defect occurs on the wafer surface or in the device active layer, it causes increases in leakage current and poor gate oxide integrity (GOI).

Further, grown-in defects introduced during the growth of silicon single crystal using the CZ process were not considered problems in line with the increased integration and downscaling of metal oxide semiconductor (MOS) large scale integration (LSI) up to the 16 megabit dynamic random access memory (16M DRAM) stage However, because it markedly degrades the GOI characteristics of an MOS capacitor, for 64M DRAM and subsequent devices, the suitability of the near-surface crystallinity of a silicon single crystal substrate win be a major factor in determining device reliability and yield.

Therefore, as a method of improving GOI characteristics during the growth of single crystals via the CZ process, it has been proposed (Kokai No. 2-267195) that a crystal growth rate wherein a crystal is pulled at a slow speed of less than 0.8 mm/min can greatly improve the GOI characteristics of a silicon single crystal substrate.

Further, as a method for reducing grown-in defect in silicon single crystals, it has been proposed (Kokai No. 8-12493) that crystal growth be carried out by setting the cooling rate in the temperature range between 1,150° C. and 1,000° C. to less than 2.0° C./min.

As a separate procedure, it was disclosed in Kokai No. 5-319987 and Kokai No. 5-319988 that grown-in defect introduced during crystal growth can be shrunk and eliminated, and the reliability of a gate oxide layer can be improved by annealing a silicon single crystal ingot at between 1,150° C. and 1,400° C. immediately after it has been pulled via the CZ process.

Further, as a means of wafer annealing, Kokai No. 60-231365, Kokai No. 61-193456, and Kokai No. 61-193458 and others disclosed a method for forming a DZ layer by promoting the outward diffusion of oxygen near a silicon wafer surface layer by annealing a silicon substrate for 5 minutes or longer at temperatures ranging from 950° C. and 1,200° C. in a hydrogen environment or a hydrogen-containing environment.

Meanwhile, heavy metal contaminants typified by iron (Fe), nickel (Ni) and copper (Cu) occur in a high-temperature annealing process in the processing of an ultra large scale integration (ULSI) device. When these heavy metal contaminants cause the formation of wafer near-surface defects and deep level in forbidden band, which degrades a carrier lifetime, device characteristics deteriorate. It is therefore necessary to remove these heavy metal contaminants from the wafer near-surface, a task that has been accomplished for some time now using IG and various extrinsic gettering (EG) procedures.

It is clear that device processing in the future will achieve yet higher levels of integration and lower the temperature of processes that use high energy ion implants. When this happens, it is predicted that the growth of BMD during processing will become difficult in low temperature processes. Therefore, it will be difficult to achieve the same adequate IG effects with low temperature processes as are possible with high temperature processes. Further, even if processing temperatures are lowered, it will be difficult to avoid heavy metal contaminants such as those in high-energy ion implant processes, thus making gettering technology imperative.

Up until now, DZ-IG processing has been widely used to heighten the quality surface active region of silicon wafers grown using an ordinary CZ process. As explained above, this method reduces interstitial oxygen, which comprises the core of a micro-defect, and forms a oxygen precipitate-free denuded zone (DZ) layer in the device active region by outwardly diffusing oxygen in the wafer near-surface by subjected the wafer to high-temperature processing at temperatures ranging between 1,100° C. and 1,200° C. Thereafter, low-temperature annealing is performed at between 600° C. and 900° C. in order to form oxygen precipitate nuclei in the wafer bulk.

However, as a method for improving GOI characteristics during growth of a single crystal via the CZ process, the above-described method of slowing down the crystal growth rate to less than 0.8 mm/min greatly lowers productivity by slowing down the crystal pulling rate. Another problem with this method is that it produces a crystal that is rich in interstitial silicon atoms, and generates a dislocation loop attributable to excess interstitial silicon atoms. On the other hand, it is also impossible to eliminate grown-in defect by lowering the cooling rate in the temperature range from 1,150~1,000° C. to less than 2.0° C./min when pulling a silicon single crystal.

The method for annealing a silicon ingot directly at a temperature higher than 1,150° C. but lower than 1,400° C.

generates dislocation and slip throughout the ingot, rendering the product unusable. On the other hand, although the method of annealing a silicon wafer at between 900° C. and 1,200° C. in a hydrogen environment or hydrogen-containing environment certainly eliminates grown-in defects on the surface or near-surface silicon regions to a depth of about 2 μm, the need to once again mirror polish the wafer surface to remove the particles that adhere to the wafer surface during the annealing process, and the surface scratches resulting from wafer transport, drastically reduces the effects of that annealing method.

DRAM devices with trench capacitors can not expect enhancing device characteristics at all, since the trench capacitors extend to about 8~10 μm depth from the surface and the existence of grown-in defect causes leakage current.

Furthermore, wafer annealing is generally done either in a horizontal or vertical furnace, and the wafers undergoing annealing are placed one-wafer-per-slot in a boat made of either silicon carbide (SiC) or quartz, making it difficult to process large numbers of wafers at the same time.

Accordingly, a method for annealing large numbers of silicon single crystal wafers and the equipment therefor have been disclosed in Kokai No. 57-97622 and Kokai No. 53-25351, and are depicted in FIG. 18.

This configuration calls for placing a plurality of silicon single crystal wafers 1 one beside the other transversely in a perpendicular state inside a silicon boat 2, supporting this stack of silicon single crystal wafers 1 by pressure applied via backslides 3 at both ends of the stack, and heat processing the supported silicon single crystal wafers 1 in this silicon boat 2 inside an annealing furnace 4. Since the backslides 3 maintain even pressure from both ends on all of the plurality of silicon single crystal wafers 1 lined up transversely like this, it is possible to diffuse high concentrations of impurities deep within the wafers with little warpage and slight variations in diffusion depth and surface concentrations.

Generally, when a slip dislocation occurs in a silicon wafer, devices fabricated on that silicon substrate are adversely affected by increased leakage current generated from the slip dislocation, and can not stand up to practical use. With the annealing equipment depicted in FIG. 18, silicon single crystal wafers 1 are lined up side-by-side transversely in a silicon boat 2, and since the edges of these silicon single crystal wafers 1 come in contact with the silicon boat 2, there has been a problem of slip dislocation formation occurring during annealing at all the contact points of all the stacked silicon single crystal wafers 1. This equipment has not yet been used in actual production operations.

As explained above, there is no method for completely eliminating grown-in defects induced during CZ crystal pulling. As a countermeasure, there is a strong movement in support of growing silicon epitaxially on the surface of CZ-grown silicon wafers. This epitaxial layer exhibits extremely good GOI characteristics. But there are numerous drawbacks to this approach. First of all, epi wafers imply high manufacturing cost. $SiHCl_3$ and $SiH_2Cl_2$ are used as the silicon source materials, and HCl gas is used in the wafer cleaning process. The chlorine atoms therein promote the corrosion of piping, facilitate the generation of heavy metal contaminants.

The nature of the grown-in defects in a octahedral void defect surrounded by (111) surface with a few nm oxide film, as shown in FIG. 17B. When the grown-in defects are exposed on the surface in following wafer shaping processes, as shown in FIG. 17A, quadrangular pyramid-shaped concave pits with a diameter of between 0.1~0.2 μm, so called COP (crystal originated particle), appear and have adversely affected GOI characteristics. However, in the past, no matter what conventional annealing method was used, it was impossible to reduce grown-in defects from surface active region.

DISCLOSURE OF THE INVENTION

An object of the present invention is to provide a silicon single crystal wafer annealing method capable of increasing the number of silicon single crystal wafers processed during a single annealing process and of avoiding slip formation in high-temperature annealing environments when carrying out a variety of annealing processes on silicon single crystal wafers, to include oxygen outward diffusion annealing for forming a DZ layer, annealing that generates and controls BMD for furnishing IG functions, and annealing that endeavors to improve and enhance device characteristics by eliminating surface COPs and internal grown-in defects.

The inventors carried out various studies aimed at developing an annealing method capable of preventing dislocation and slip in high-temperature annealing environments, and of uniformly exerting the same annealing effect on wafers when annealing silicon single crystal wafers, no matter whether 10 wafers were placed into the same furnace at the same time, or whether a large volume of wafers, say over 100, were placed into the same furnace at the same time. As a result, they learned that it is possible to stack up around 10 wafers, and, treating this group as a unit, to place this group, either horizontally or slightly inclined at roughly 0.5~5°, into a boat, which makes contact with and supports the outer circumferences of the wafers at a plurality of locations, and when annealing is performed at over 1,100° C. to promote the outward diffusion of oxygen, for instance, even if a dislocation or slip should occur in the bottommost wafer in the boat, the propagation of this defect to the wafer adjacent to this one can be prevented, and DZ layers can be formed on all the wafers at the same time.

The inventors also learned that when annealing is carried out by treating a large number of stacked wafers as a group, and stacking a plurality of such groups in multiple levels with the wafers in the vertical direction within the soaking zones of a loaded annealing furnace, a large volume of wafers can be annealed at the same time, dislocation and slip can be prevented, and the same annealing effect can be exerted uniformly on all wafers.

That is, it was learned that over three times the usual number of wafers can be annealed simultaneously in the same process using a conventional annealing furnace, and there is no increase in overall dislocation and slip as in the annealing process formerly known as ingot annealing, making it possible to achieve high productivity and high yields.

As a result of various additional studies, the inventors learned that:

1) By installing a buffer plate (layer) on the inner supports of the above-described incline-capable boat, and installing a disc or ring made of a material with outstanding strength at elevated temperatures, such as Si, SiC, ceramics or alumina, at the lowest layer of a large number of wafers treated as a group, dislocation and slip do not occur;

2) When annealing is performed in an oxygen environment, or an oxygen-containing environment, wafers do not adhere to one another; and 3) When, as needed, the wafers to be annealed have not been polished, or have not undergone final (finishing) polishing, the wafers definitely do not adhere to one another.

Furthermore, the inventors learned that when annealing using the above-described invention, by heat treating wafers at over 1,100° C., for example, by processing wafers for between five minutes and six hours at temperatures ranging from 1,100° C. to 1,350° C. during ramp up or ramp down, defect-free regions (DZ layers) can be formed in the surface layers of each of a large volume of wafers.

When the inventors carried out additional studies aimed at optimizing annealing conditions for forming defect-free regions (DZ layers), it was learned that:

1) During the ramp up process to a temperature in excess of 1,100° C., when annealing is performed by maintaining a fixed temperature or a plurality of fixed temperatures for more than 10 minutes but less than four hours within a temperature range from 500° C. to 900° C., IG functions can be provided by the formation of BMD;

2) When the ramp up rate within the temperature range from 500° C. to 900° C. is set between 0.5° C./min and 5° C./min, BMD can be formed to provide IG functions;

3) During the ramp down process following sustained heating at a temperature in excess of 1,100° C., when annealing is performed by maintaining a fixed temperature or a plurality of fixed temperatures for more than 10 minutes but less than 16 hours within a temperature range from 500° C. to 900° C., BMD can be formed to provide IG functions;

4) During the ramp down process following sustained heating at a temperature in excess of 1,100° C., when the ramp down rate within the temperature range from 500° C. to 900° C. is set between 0.5° C./min and 5° C./min, BMD can be formed to provide IG functions.

Furthermore, the inventors learned that, when annealing is performed using the above-described invention, large volumes of wafers can be processed simultaneously, and that grown-in defect, which are the source of surface layer COP, as well as internal grown-in defects, can be reduced or even eliminated in each wafer by heat treatment at over 1,250° C., for example, at temperatures ranging from 1,280° C. to 1,380° C. for between five minutes and six hours; and that, when annealing at the above-mentioned temperature of over 1,250° C., annealing which forms the above-described defect-free regions (DZ layers) can be combined with annealing for the provision of IG functions, enabling the manufacture of high-quality silicon single crystal wafers. The inventors then perfected the present invention.

BEST MODE FOR CARRYING OUT THE INVENTION

Figure 1A:
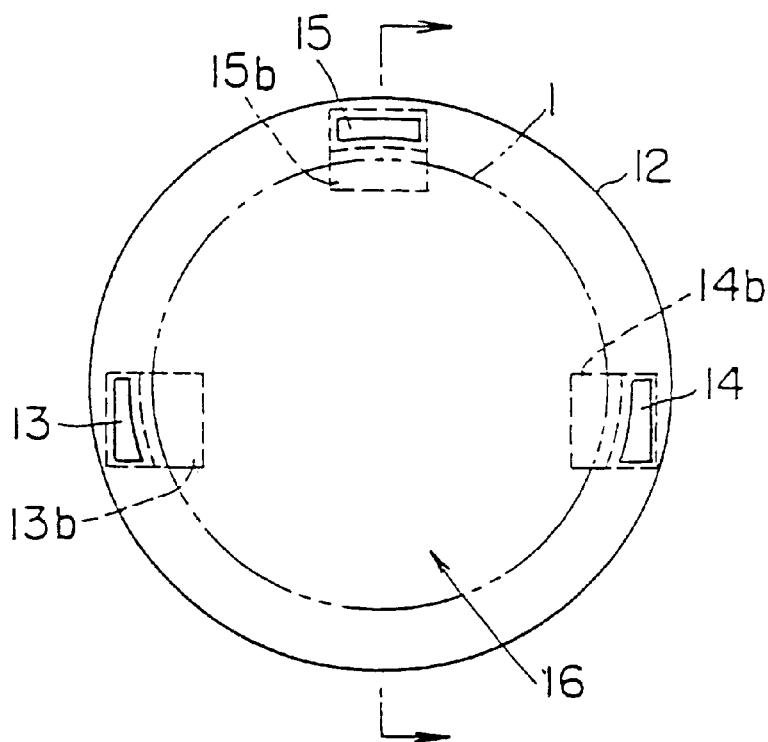
FIG. 1A depicts a top view of an annealing boat used in an annealing method of the present invention.
Figure 1B:
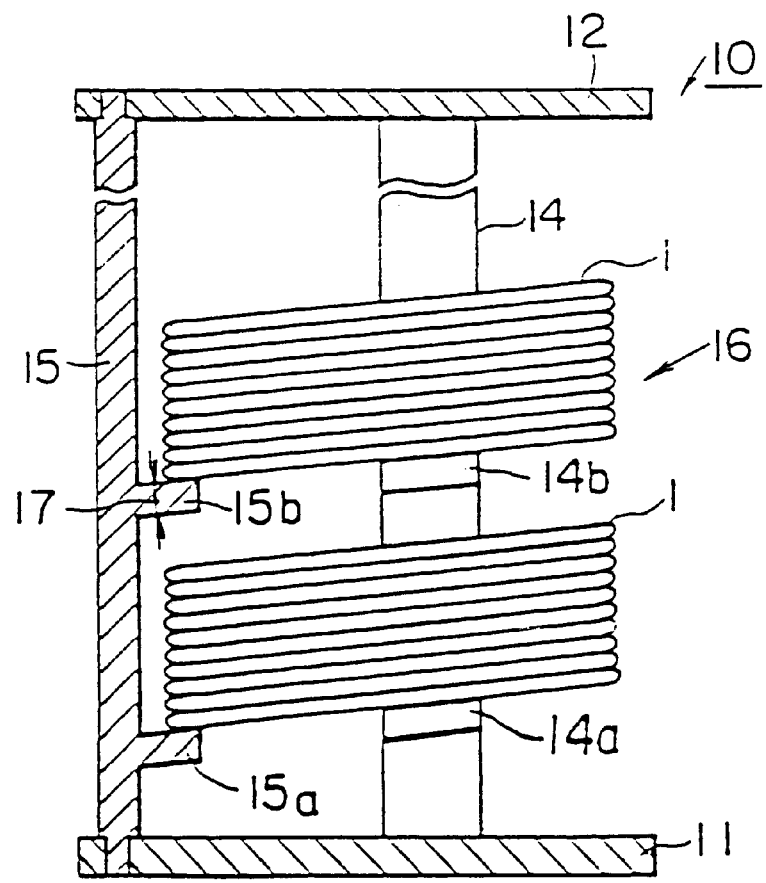
FIG. 1B is a schematic diagram depicting a longitudinal (side) view of this annealing boat from the perspective indicated by the arrows in FIG. 1A.

FIG. 1 depicts one example of annealing equipment used in an annealing method of the present invention. This annealing equipment comprises a vertical annealing furnace, not shown in the figure, plus an annealing boat 10, which is made of a material that possesses outstanding strength at elevated temperatures, such as porous SiC, or Si-impregnated SiC, and which is capable of supporting a plurality of groups of silicon single crystal wafers 1, each group comprising 10 silicon single crystal wafers 1 stacked one on top of the other as shown in the figure, and performs a variety of annealing on each of the groups of silicon single crystal wafers 1 supported by this annealing boat 10. For example, the types of annealing performed include that for DZ-IG processing, which calls for ramping up to 1,000° C.

at a rate of 1° C./minute, maintaining a temperature of 1,280° C. for two hours, the cooling down by ramping down from 1,000° C. at a rate of 1° C./minute, and that for DZ processing, which calls for annealing within a temperature range of more than 1,150° C. but less than 1,380° C. within a time range of more than five minutes but less than six hours.

This annealing boat 10 comprises a disc-shaped bottom plate 11 and a disk-shaped top plate 12, and three support plates 13, 14, 15, and the three support plates are arranged as anterior support plates 13, 14 and a posterior support plate 15 to form a cylindrical space between the bottom plate 11 and the top plate 12, with a pair of these support plates located one at each end of a diametric of a disc, and the third located at one end of a diametric that passes straight between the pair, and both ends of each of these plates are fastened between the bottom plate 11 and the top plate 12. There are also posterior support holders 15a, 15b . . . , which are provided in an extended condition at a plurality of locations at predetermined heights on this posterior support plate 15, and anterior support holders 13a, 13b . . . , 14a, 14b . . . , which are provided in an extended condition on the anterior support plates 13, 14 at locations slightly higher than the posterior support holders 15a. The annealing boat is configured so that an opening is formed between the above-described pairs of anterior support holders 13a, 13b . . . , 14a, 14b . . . , and stacked groups of silicon single crystal wafers 1 are inserted into the boat through this opening 16.

The top faces of the above-described posterior support holders 15a, 15b . . . are formed so as to protrude from the surface of the posterior support plate 15 so that the front rises up toward the above-described opening 16, and the top faces of the above-described anterior support holders 13a, 13b . . . , 14a, 14b . . . are formed as inclined faces that correspond to extensions of the top faces of the above-described posterior support holders 15a, 15b . . . .

Since each group of stacked silicon single crystal wafers 1 is loaded onto the respective anterior and posterior support holders 13a, 14a, 15a, 13b, 14b, 15b in this way, slip only occurs in the bottommost silicon single crystal wafer 1 in each wafer 1 group, and the silicon single crystal wafers 1 stacked on top of this bottom wafer only touch one another and do not come in contact at all with anything else, making it possible to achieve slip-free annealing.

As explained above, the stacked silicon single crystal wafers can also be loaded directly onto the respective support holders. It is also possible to utilize a configuration whereby a disc or ring made of a material that possesses outstanding strength at elevated temperatures, such as SiC or ceramics for example, is installed on top of the respective support holders, and stacked groups of silicon single crystal wafers 1 are loaded onto these circle- or ring-equipped support holders, or silicon single crystal wafers are stacked up on top of the above-described disc or ring, and this is treated as a group, and loaded onto the respective support holders.

That is, slip occurs due to the affects of the precision of the installed disc or ring only in the bottommost silicon single crystal wafer 1 in each wafer 1 group, and the silicon single crystal wafers 1 stacked on top of this bottom wafer only touch one another and do not come in contact at all with anything else, making it possible to achieve slip-free annealing. Here, the thickness of the disc or ring installed under the group of silicon single crystal wafers 1 should be around 2 mm~7 mm. And the thickness 17 of the support holders in the annealing boat 10 should be around 4 mm~6 mm.

Figure 3:
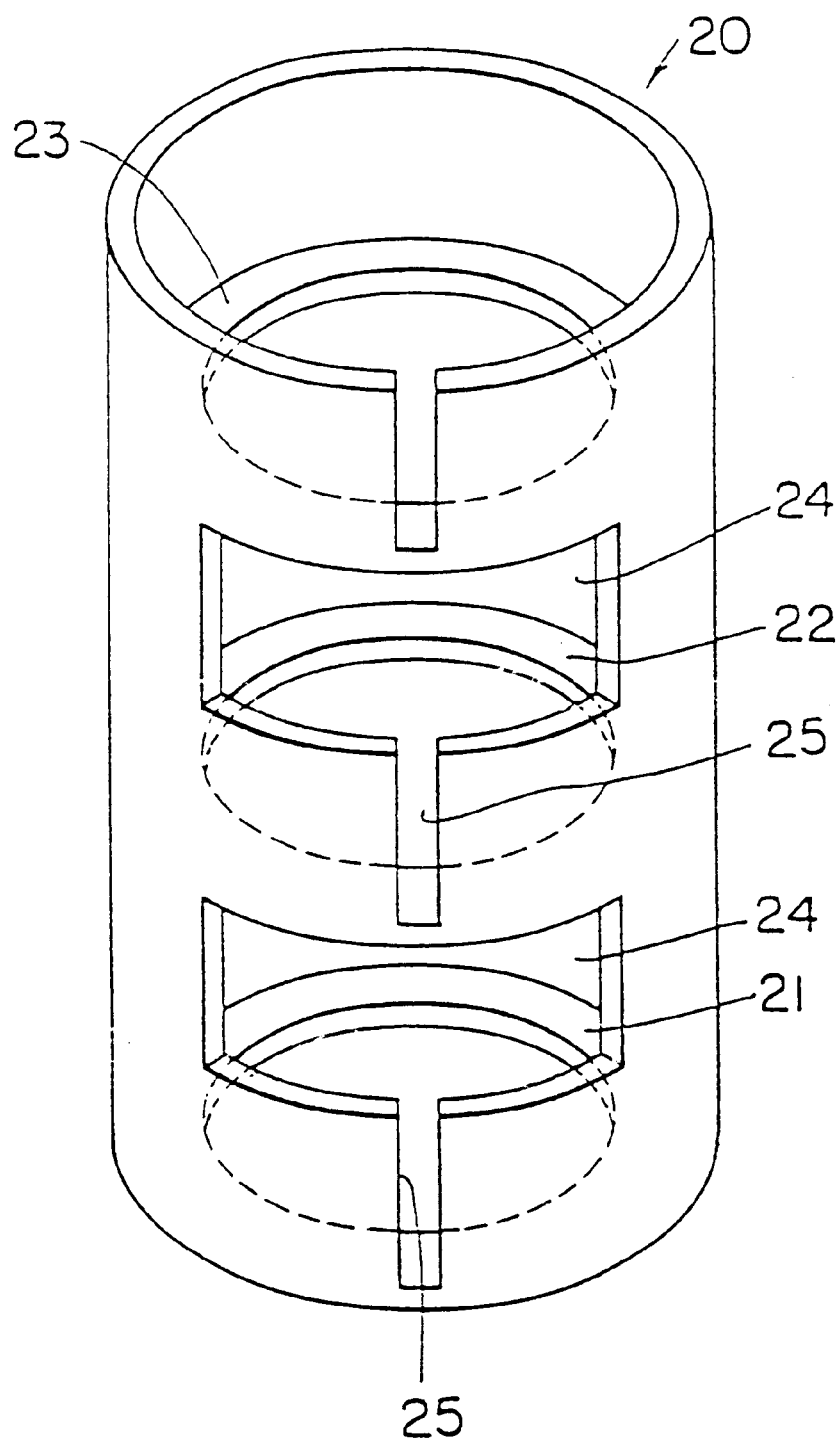
FIG. 3 depicts an oblique view of another embodiment of an annealing boat used in an annealing method of the present invention.
Figure 4:
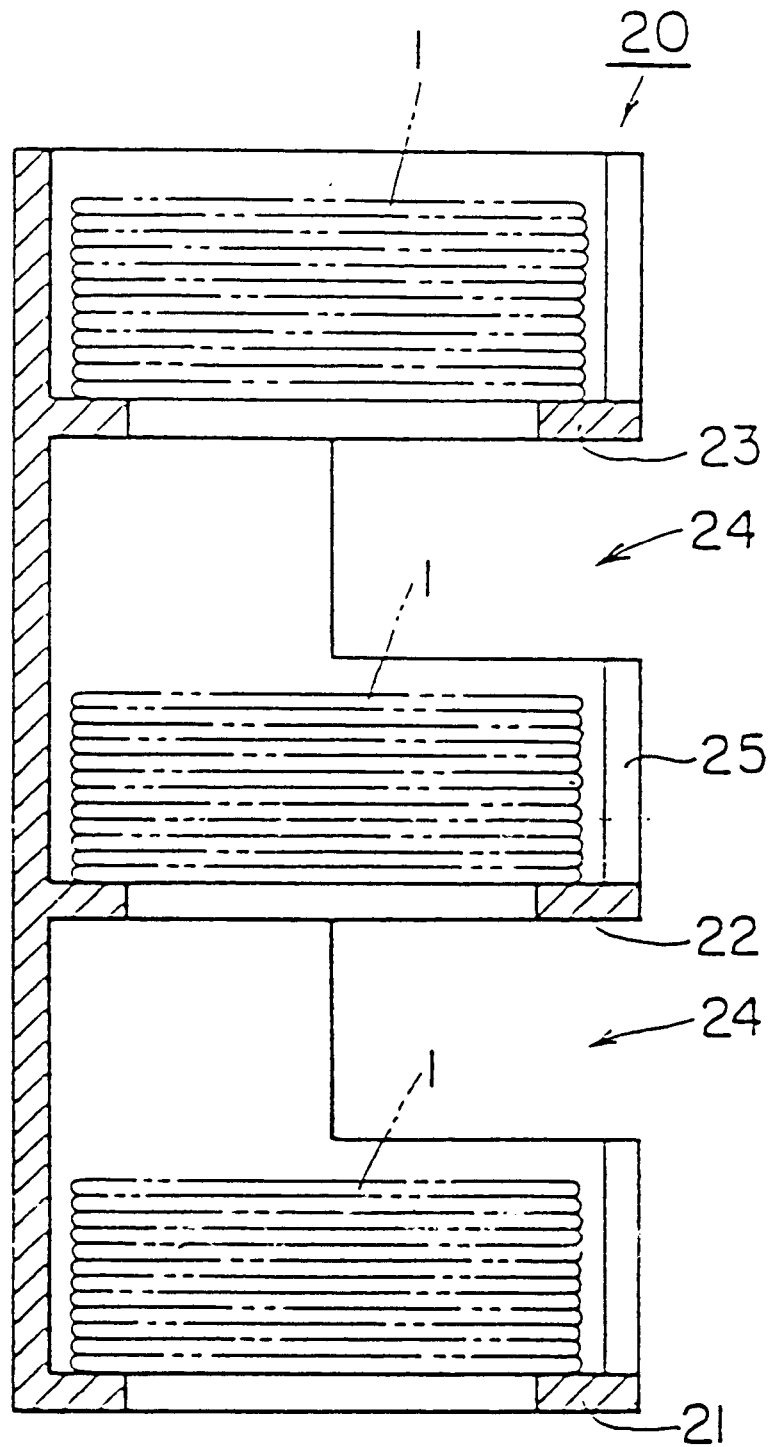
FIG. 4 depicts a longitudinal (side) view of the annealing boat depicted in FIG. 3.

The annealing equipment used in an annealing method of the present invention depicted in FIG. 3 and FIG. 4 is an example of an annealing boat 20 into which groups of stacked silicon single crystal wafers 1 are loaded horizontally. The annealing boat 20 consists of a cylinder, and comprises a configuration whereby ring-shaped support holders 21, 22, 23 . . . are provided and arranged around the periphery of the inner surface at predetermined intervals, and along one side of the outer surface, an opening 24 and a vertical insertion slot 25 are formed for inserting inside the cylinder an entire jig (not depicted in the figure) loaded with a group of a required plurality of stacked silicon single crystal wafers 1, and the groups of wafers 1 are loaded onto the respective ring-shaped support holders 21, 22, 23 described above.

Further, a group of wafers 1 is inserted and loaded onto the topmost support holder 23 using an opening and insertion slot 25 in the top face of the boat 20. Also, for the above-described annealing boat 20 as well, it is also possible to utilize a configuration whereby a disc or ring made of a material that possesses outstanding strength at elevated temperatures, such as SiC or ceramics, for example, is installed on top of the respective support holders, and stacked groups of silicon single crystal wafers 1 are loaded onto these circle- or ring-equipped support holders, or silicon single crystal wafers are stacked up on top of the above-described disc or ring, and this is treated as a group, and loaded onto the respective support holders.

Figure 5:
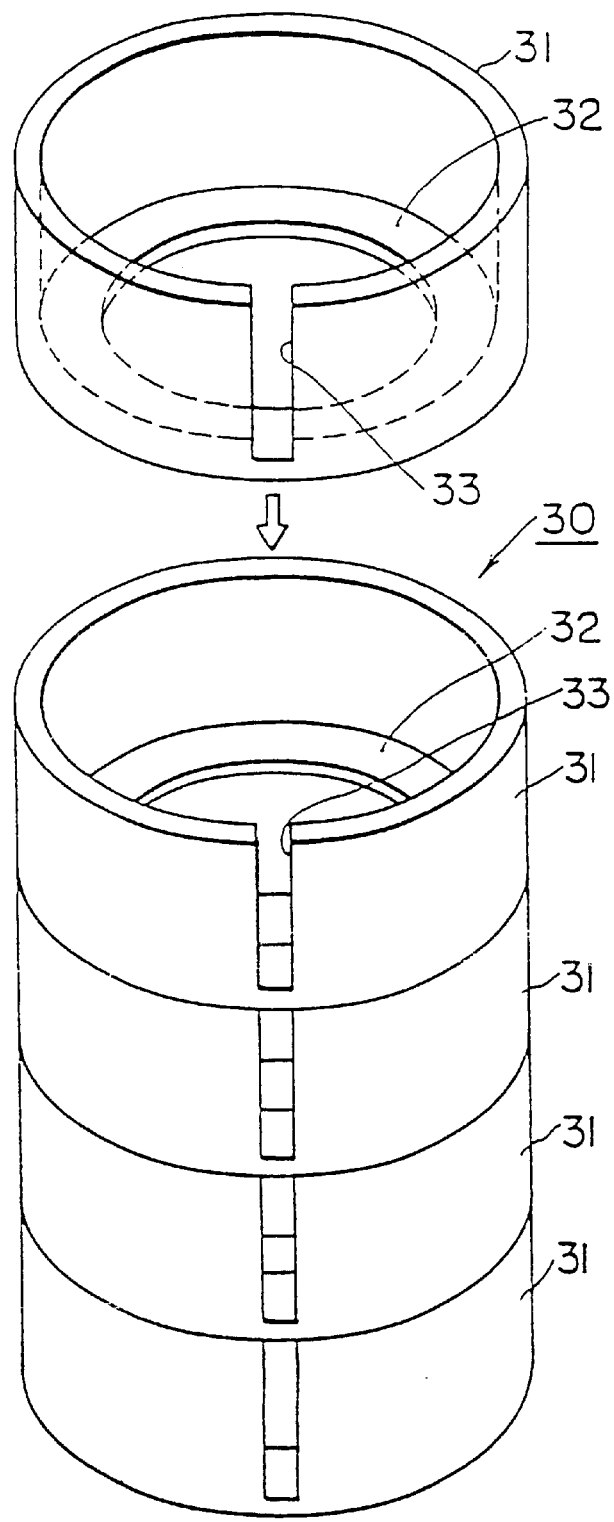
FIG. 5 depicts an oblique view of another embodiment of an annealing boat used in an annealing method of the present invention.
Figure 6A:
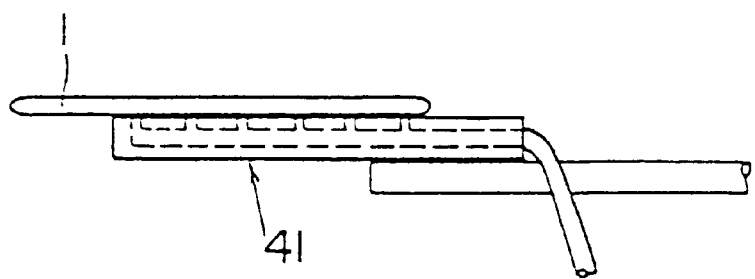
FIG. 6 depicts schematic diagrams of the configurations of conventional single-wafer-style transport robots, with A depicting a vacuum chacking-type configuration and B depicting a ladle-type configuration.
Figure 6B:
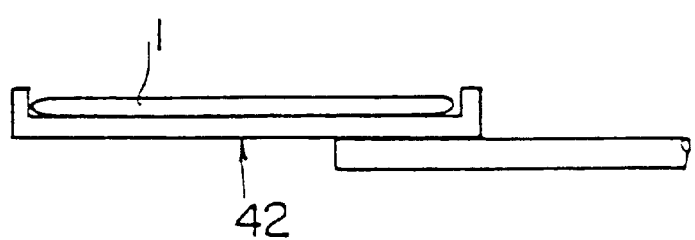

The annealing boat 30 used in an annealing method of the present invention depicted in FIG. 5 comprises short cylindrical boat units 31, a ring-shaped support holder 32 is provided and arranged around the periphery of the inner surface of a boat unit 31, and along one side of the outer surface, a vertical insertion slot 33 is formed, creating a configuration whereby it is possible to use the top face opening and insertion slot 33 in a boat unit 31 to insert an entire jig (not depicted in the figure) loaded with a group of a required plurality of stacked silicon single crystal wafers 1, and to load this group of wafers 1. By stacking up vertically one on top of the other the boat units 31 loaded with these groups of silicon single crystal wafers 1, a plurality of groups of silicon single crystal wafers 1 can be loaded into a furnace similar to the annealing boat 20 depicted in FIGS. 3 and 4, enabling the simultaneous annealing of a large volume of wafers.

For the annealing boat 30 depicted in FIG. 5 as well, the support holders 32 can also be discs, and it is possible to utilize a configuration whereby a disc or ring made of a material that possesses outstanding strength at elevated temperatures, such as SiC or ceramics, for example, is installed on top of the respective support holders, and stacked groups of silicon single crystal wafers 1 are loaded onto these circle- or ring-equipped support holders, or silicon single crystal wafers are stacked up on top of the above-described disc or ring, and this is treated as a group, and loaded onto the respective support holders.

In the support holders of each of the annealing boats 10, 20, 30 described above, a step with an inner diameter that adjoins the periphery of a wafer 1 can be formed on the surface whereon a silicon single crystal wafer 1 is loaded. This step can facilitate the positioning of a silicon single crystal wafer 1 that is loaded onto a support holder, and the periphery of the second and subsequent silicon single crystal wafers 1 from the bottommost wafer can be prevented from coming in contact with the main part of the annealing boat.

The present invention opines and proposes that in a conventional DZ layer formation annealing process, for example, by stacking up a large number of wafers instead of inserting one wafer in each boat slot, and annealing these wafers at a temperature in excess of 1,100° C., an outward diffusion of interstitial oxygen can be formed even in wafers that are adjacent to one another, and the wafer in-plane outward diffusion distribution will be good. Therefore, it becomes necessary to stack up a large number of wafers, and to transport these wafers all at once as a group.

Conventional silicon wafer transport methods comprise a vacuum chacking-type transport robot, wherein a suction plate 41 is mounted to an arm 40, and a ladle-type system, wherein a loading plate 42 is mounted to an arm 40. Both types of wafer transport robots transport single wafers. Using a conventional single-wafer-style transport robot to stack wafers into a single slot of an annealing boat requires more complex equipment, and is extremely expensive.

Figure 7:
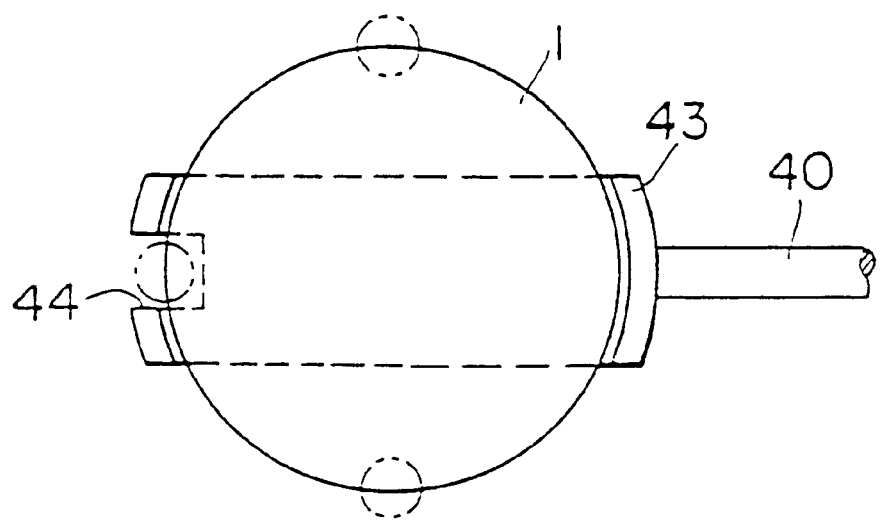
FIG. 7 depicts a top view of the configuration of a wafer transport robot used in the present invention.

Accordingly, as equipment for transporting a plurality of stacked wafers at the same time, the example depicted in FIG. 7 is a ladle-type wafer transport robot for the annealing boat 10 depicted in FIG. 1, that is, a boat with three-point support, comprising a configuration, whereby an arm 40 is mounted to a jig 43, which has arc-shaped support walls at both ends of a curved, rectangular-shaped base plate, and which is able to horizontally stack and store wafers 1 between the pair of arc-shaped support walls, and a notch 44 is cut into one of the arc-shaped support walls to provide clearance for a boat support holder (indicated in the figure by an imaginary line) during loading. After stacking a plurality of wafers onto this jig 43 (See FIG. 7), this large number of stacked wafers can be transported as a group to an annealing boat.

Figure 8A:
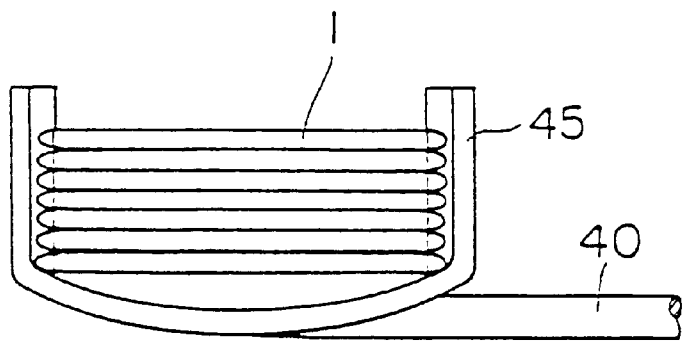
FIG. 8A depicts a front view of another configuration of a wafer transport robot used in the present invention, B depicts a top view of this robot, and C depicts a top view of another embodiment of this robot.
Figure 8B:
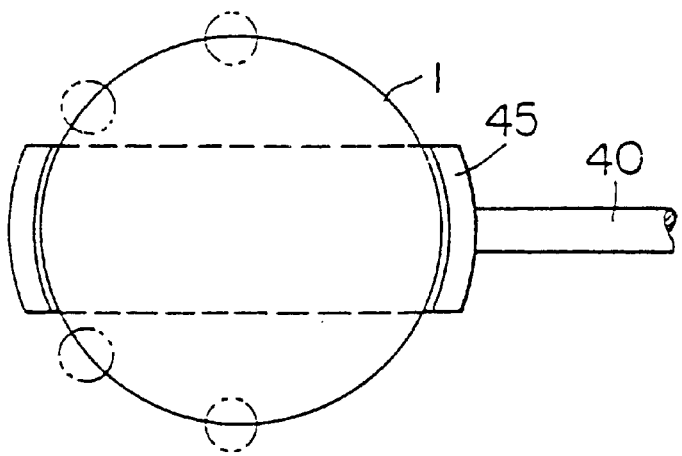
Figure 8C:
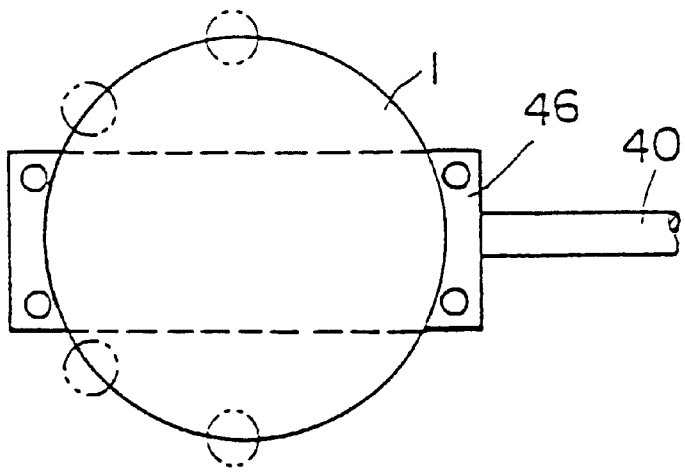

Next, as equipment for transporting a plurality of stacked wafers at the same time, the example depicted in FIG. 8A, B is a ladle-type wafer transport robot for a boat with four-point support, comprising a configuration, whereby an arm 40 is mounted to a jig 45, which has arc-shaped support walls at both ends of a curved, rectangular-shaped base plate, and which is able to horizontally stack and store wafers 1 between the pair of arc-shaped support walls. After stacking a plurality of wafers onto this jig 45, this large number of stacked wafers can be transported as a group to an annealing boat. Further, as depicted in FIG. 8C, it is also possible to use a configuration, which uses a jig 46 with two pairs of small-diameter support columns in place of the pair of arc-shaped support walls described previously. And to simplify wafer transport, silicon single crystal wafers can be stacked onto the above-described disc or ring and this can be transported as a group by a ladle-type wafer transport robot.

Figure 9A:
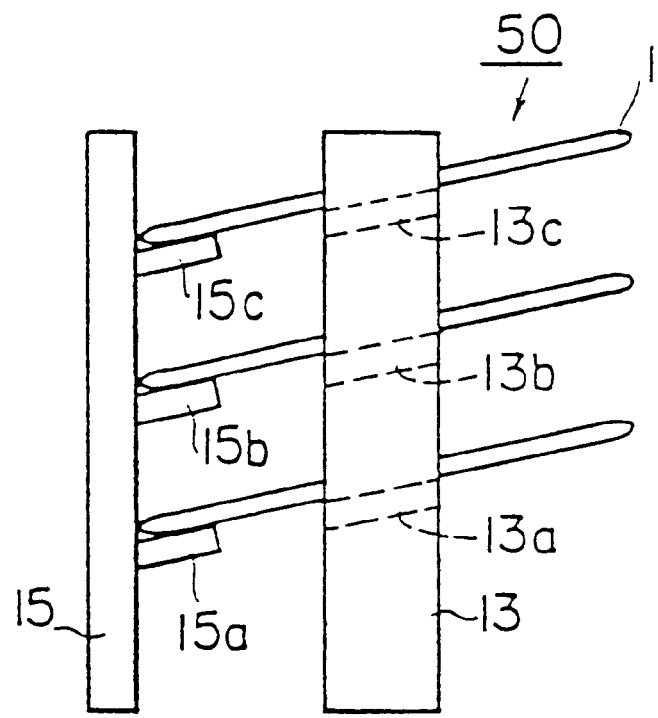
FIG. 9A depicts a schematic diagram of one example of the usage of an annealing boat used in the present invention, and B depicts a top view of this boat.
Figure 9B:
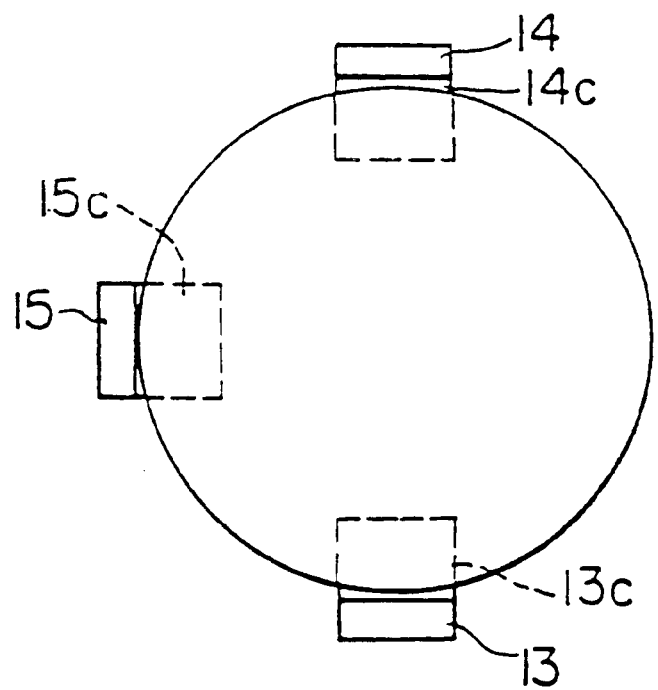

The annealing boat 50 used in an annealing method of the present invention depicted in FIG. 9 exhibits a configuration that comprises the same three anterior-posterior support plates 13, 14, 15 comprising the annealing boat 10 depicted in FIG. 1. The depiction of a plurality of stacked wafers is abridged in the figure to show only one silicon single crystal wafer. When using a ladle-type wafer transport robot to transport wafers to this annealing boat 50, a group of a large number of stacked wafers is loaded onto the respective anterior and posterior support holders 13a, 14a, 15a, 13b, 14b, 15b, 13c, 14c, 15c . . . described above. If, for example, the group of wafers should slide on the support holders and come in contact with the posterior support plate 15, a localized temperature difference occurs at the point of contact during high-temperature annealing between the wafer end faces and the boat, generating slip.

Figure 10A:
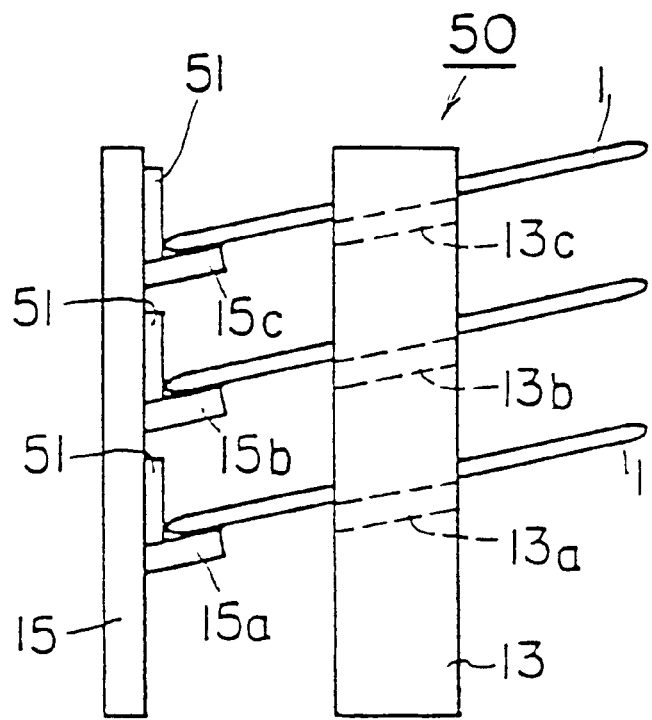
FIG. 10A depicts a schematic diagram of one example of a configuration of an annealing boat used in the present invention, and B depicts a top view of this boat.
Figure 10B:
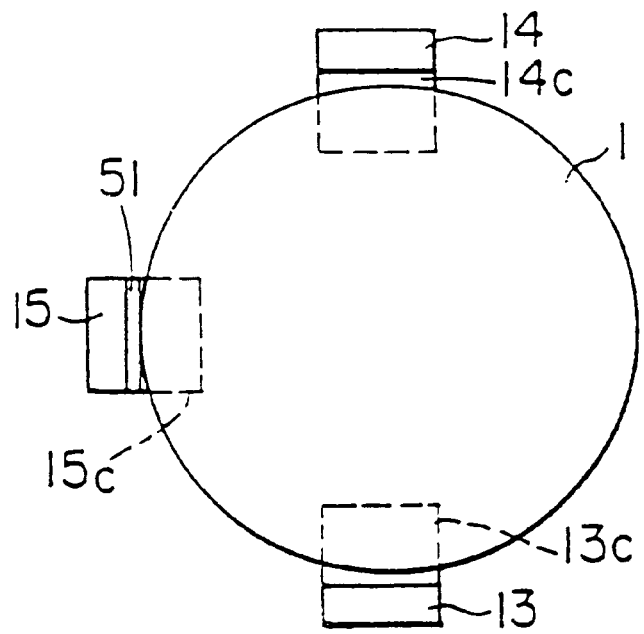

Accordingly, as shown in FIG. 10, by installing a rectangular buffer made of a material that exhibits outstanding strength at elevated temperatures, such as SiC, Si or alumina, for instance, to the annealing boat's 50 posterior support plate 15 at the starting point of the incline of the support holder, even if the wafers slide, the wafer end faces will come in contact with the buffer 51, and the existence of the buffer 51 alters thermal conduction and heat transfer, thereby reducing localized temperature difference and curbing slip generation.

With the present invention, a group of a large number of stacked wafers are loaded into an annealing boat at an incline, and this angle of inclination should be less than 45(from the horizontal, with 0.5~5° being the most desirable. If this angle is more than 0.5°, it is possible to prevent wafers from dropping out of a boat during annealing or during wafer transport as a result of inter-wafer sliding. If the angle of inclination is larger than 45°, wafer transport becomes difficult.

With the present invention, silicon single crystal wafers to be annealed consist of wafers that have been etched, wafers that have undergone various mirror polishing processes and a finishing mirror polishing process, as well as wafers that have not been polished, but unpolished wafers are better since they can prevent wafers from sticking to one another. And in view of the metallic contaminants generated during wafer annealing, wafers should be subjected to common RCA cleaning, for example, cleaning steps SC-1+SC-2, prior to annealing.

The amount of silicon surface removed by polishing after annealing should be small, with from 0.1 $\mu$m to 20 $\mu$m being desirable. If the above-mentioned amount of silicon removed during the process is less than 0.1 $\mu$m, it is difficult to improve surface precision, and when it exceeds 20 $\mu$m, process loss increases, and productivity decreases as a result of problems related to the time required for mirror polishing. Therefore, keep the amount of silicon removed during the polishing process to between 0.1 $\mu$m and 20 $\mu$m. Between 1 $\mu$m and 5 $\mu$m is even better.

Further, annealing performed at temperatures ranging from 950° C. to 1,000° C. in a non-oxide gas environment (argon (Ar) or $H_2$ gas) to stack and anneal wafers using the method of the present invention etches off (sublimates) the natural oxide film that grows on the wafer surface facilitating the strong adhesion to one another of adjacent etched-off wafers. Since this inter-wafer adhesion is powerful, it is difficult to separate the wafers after annealing. Therefore, with the present invention, annealing in diluted oxygen environment, such as $O_2/Ar$ or $O_2/N_2$, for example, is preferable as it facilitates separation of the wafers from one another after annealing and does not cause cracking.

Further, even when annealing is performed in a hydrogen or argon gas environment, stacking up around 10 wafers by alternating wafers on which thermal oxidation layers had been generated beforehand with wafers lacking thermal oxidation layers facilitates the separation of the wafers from one another after annealing. Naturally, all the wafers to be stacked together can either be wafers on which an oxide film was generated during the previous process, or wafers on which an oxide film was grown beforehand.

With the present invention, the preferred annealing conditions for forming a defect-free region (DZ layer) is to ramp up to a temperature in excess of 1,100° C., and annealing performed at temperatures ranging from 500° C. to 900° C. for more than 10 minutes but less than four hours can provide IG functions by forming BMD. BMD for IG functions can also be formed by ramping up from 500° C. to 900° C. at a rate of between 0.5° C./min and 5° C./min. Particularly favorable conditions for this call for annealing at between 600° C. and 800° C. for more than 30 minutes but less than one hour, or ramping up from 600° C. to 800° C. at a rate of between 2~3° C./min.

The above-described conditions relate to ramp up, but the inventors have confirmed that maintaining a fixed temperature somewhere between 500° C. to 900° C. for more than 10 minutes but less than four hours during the ramp down process following sustained heating at a temperature in excess of 1,100° C. makes it possible to provide IG functions by forming BMD, and similarly, ramping down from 900° C. to 500° C. at a rate of between 0.5° C./min and 5° C./min can also form BMD for IG functions. Particularly favorable conditions for this call for maintaining a fixed temperature somewhere between 600~700° C. for 4~8 hours.

When it comes to annealing stacks of individual/groups of wafers using the present invention, by annealing at a temperature in excess of 1,250° C., for example, between 1,280° C. and 1,380° C., for between five minutes and six hours, a large volume of wafers can be processed simultaneously, and grown-in defects, which form the basis for surface layer COP and internal COP in each wafer, can either be reduced or eliminated. For example, as is made clear in the embodiments, it has been confirmed that annealing for two hours at 1,280° C. eliminates most COP, and that COP can be completely eliminated by annealing that maintains a high temperature of around 1,300° C., as with conditions such as 1,280° C.×four hours, and 1,300° C.×two hours in particular. Especially favorable conditions for this call for annealing at between 1,300~1,350° C. for around 2~3 hours.

In the annealing of stacks of individual/groups of wafers using the present invention, when annealing to eliminate the wafer surface layer COP described above, by combining the various previously-explained annealing conditions for forming a defect-free region (DZ layer), or the various annealing conditions for providing IG functions by forming BMD when ramping up to a temperature in excess of 1,250° C. or during the ramp down process, in addition to decreasing or eliminating surface layer COP in wafers, it is also possible to readily mass produce high-quality silicon single crystal wafers equipped with DZ-IG functions. It has been confirmed that the joint use of annealing conditions can be arbitrarily combined within the scope described above.

EMBODIMENTS

Embodiment 1

A 200-mm-diameter silicon ingot grown via the CZ process and having an oxygen concentration of 13~15×10$^{17}$ atoms/cm$^3$ (old ASTM) was ground into a cylindrical shape, following which it was sliced into wafers, and the surfaces of these silicon single crystal wafers were then etched with either an aqueous solution comprising a hydrofluoric/nitric acid mixture or a KOH solution. Then, using the previously-described annealing boat depicted in FIG. 1, these silicon single crystal wafers were stacked into groups of 10 wafers, and by vertically stacking 30 of these groups in sequence, 300 wafers were loaded into the boat.

This annealing boat was loaded into a vertical annealing furnace pre-heated to 700° C., the furnace was ramped up to 1,000° C. at a rate of 8° C./min, and then up to 1,300° C. at a rate of 1° C./min, the temperature was maintained at 1,300° C. for two hours, following which it was ramped down to 1,000° C. at a rate of 1° C./min, then down to 700° C. at a rate of 2.5° C./min, and the annealing boat was withdrawn from the annealing furnace. The environment inside the furnace comprised 20%$O_2$–80%$N_2$.

The generation of slip and dislocation in the silicon single crystal wafers subjected to this kind of annealing was confirmed via X-ray topography (XRT). Using this XRT, of the 10 stacked silicon single crystal wafers, support holder-generated slip was observed only in the bottommost silicon single crystal wafer at the point of contact with each support holder. Slip and dislocation were not observed in the second and subsequent silicon single crystal wafers from the bottom. This condition was the same for each group of wafers.

Next, this wafer was etched in an HF solution to remove an oxide film formed during annealing, following which, it was subjected to a mirror polishing process which removed around 10 μm from the surface of the wafer. After that, a gate oxide layer (25 nm thick) was formed in a dry gaseous oxygen environment, a polycrystalline silicon layer was deposited, this polysilicon layer was doped with phosphorous, an electrode was formed, and lithography was used to fabricate a MOS capacitor with an electrode surface area of 8 mm$^2$. Evaluation testing was carried out on the GOI characteristics of the silicon single crystal wafer on which this MOS capacitor was fabricated. Evaluation conditions designated chips with a electric field strength of over 8 MV/cm as good.

Further, using the came sample (wafer) as that described above, annealing was carried out for two hours at temperature conditions of 1,150° C., 1,250° C., 1,300° C., 1,350° C. The surface of this silicon crystal wafer 1, to include the same sample (wafer), which, for reference, was not annealed, was mirror polished and the above-described MOS capacitor was fabricated.

Figure 2:
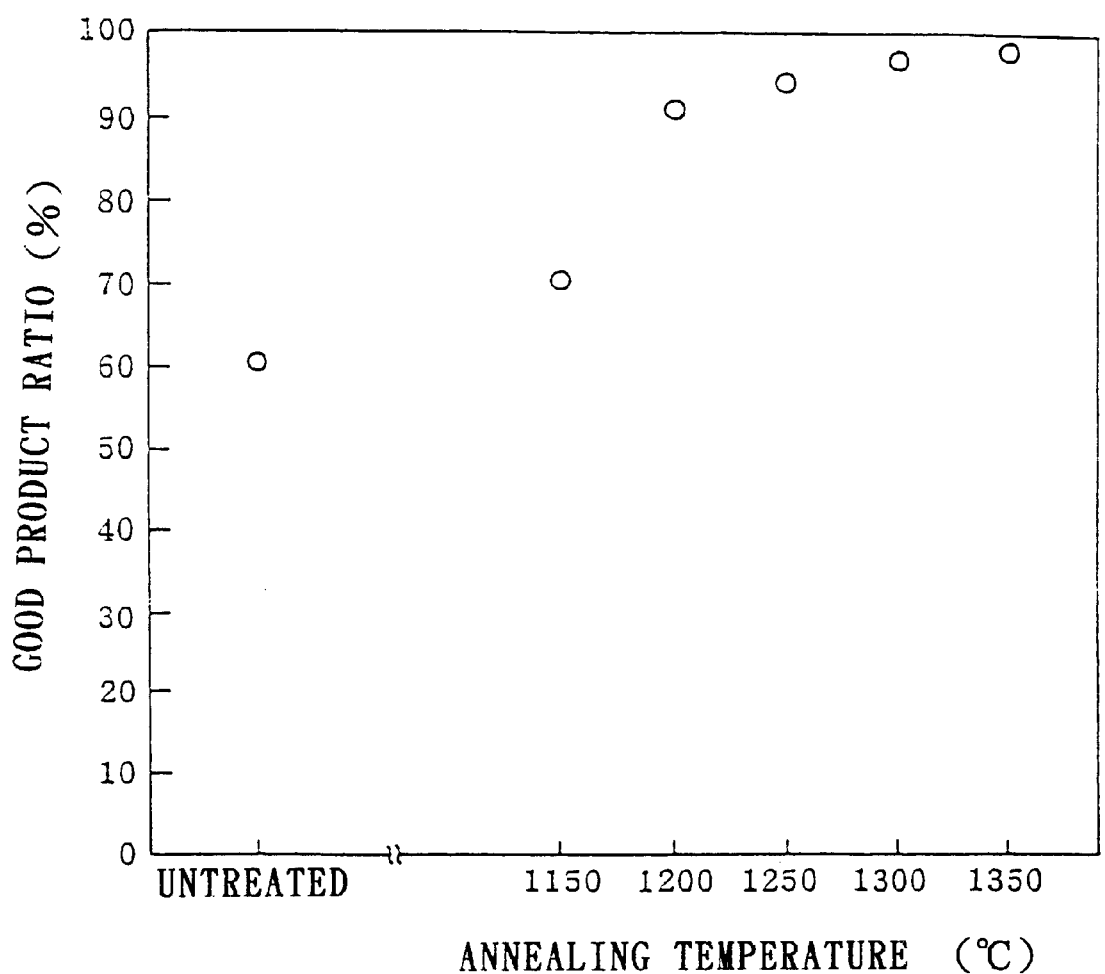
FIG. 2 is a graph depicting the relationship between annealing temperatures and GOI yield more than electric field strength of 8 MV/cm, which indicates the results of the evaluation of GOI characteristics of wafers annealed via the annealing method of the present invention.

FIG. 2 depicts the results of the above-described evaluation test. Yield of samples that did not undergo annealing exhibited a 60%, samples annealed at 1,150° C. exhibited a 70%, and those annealed at temperatures in excess of 1,200° C. exhibited a better than 90% good product ratio.

Embodiment 2

Similar to Embodiment 1, 10 8-inch (200-mm) diameter silicon single crystal wafers were stacked up and loaded into an annealing boat, and annealing was performed by ramping up from 1,000° C. to 1,280° C. at a rate of 1° C./min, and after maintaining a temperature of 1,280° C. for two hours, ramping down to 1,000° C. at a rate of 1° C./min. Also, the initial oxygen concentration used in the silicon single crystal wafers was 15×10$^{17}$ atoms/cm$^3$ (old ASTM).

Figure 11:
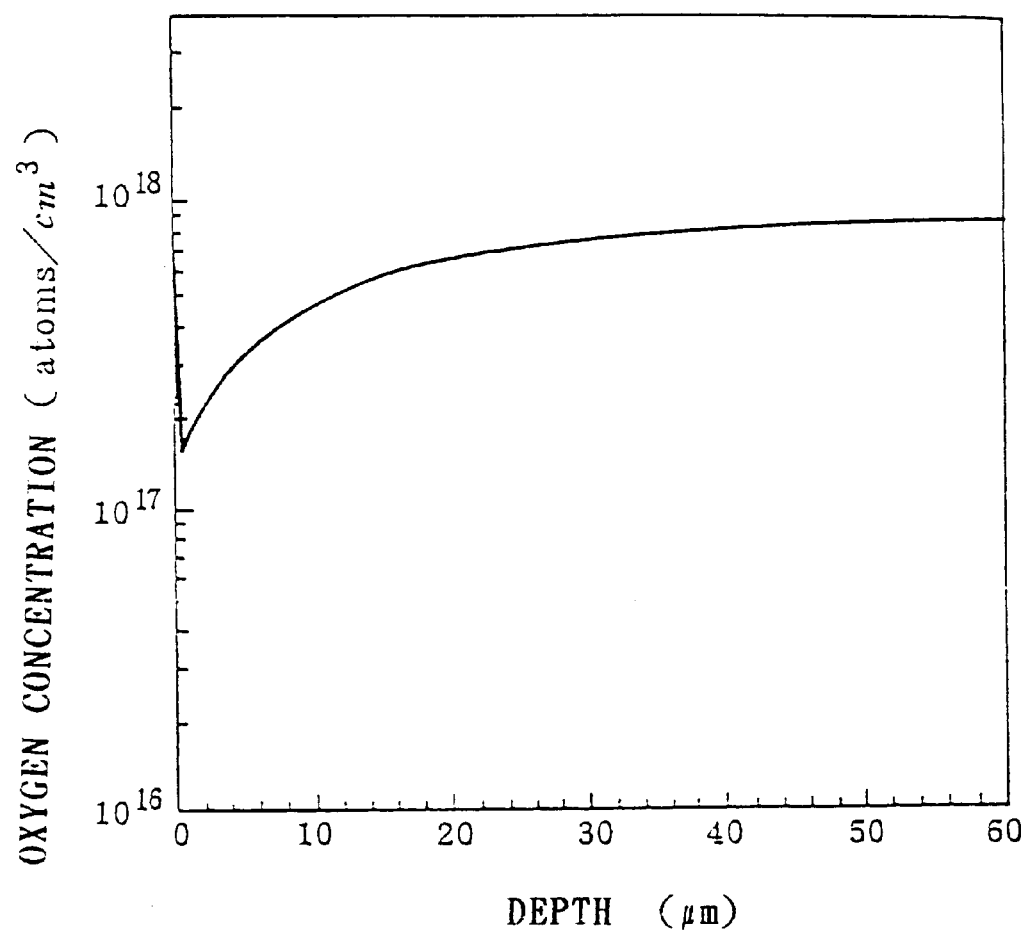
FIG. 11 is a graph depicting the relationship between depth from wafer surface and oxygen concentration.
Figure 12:
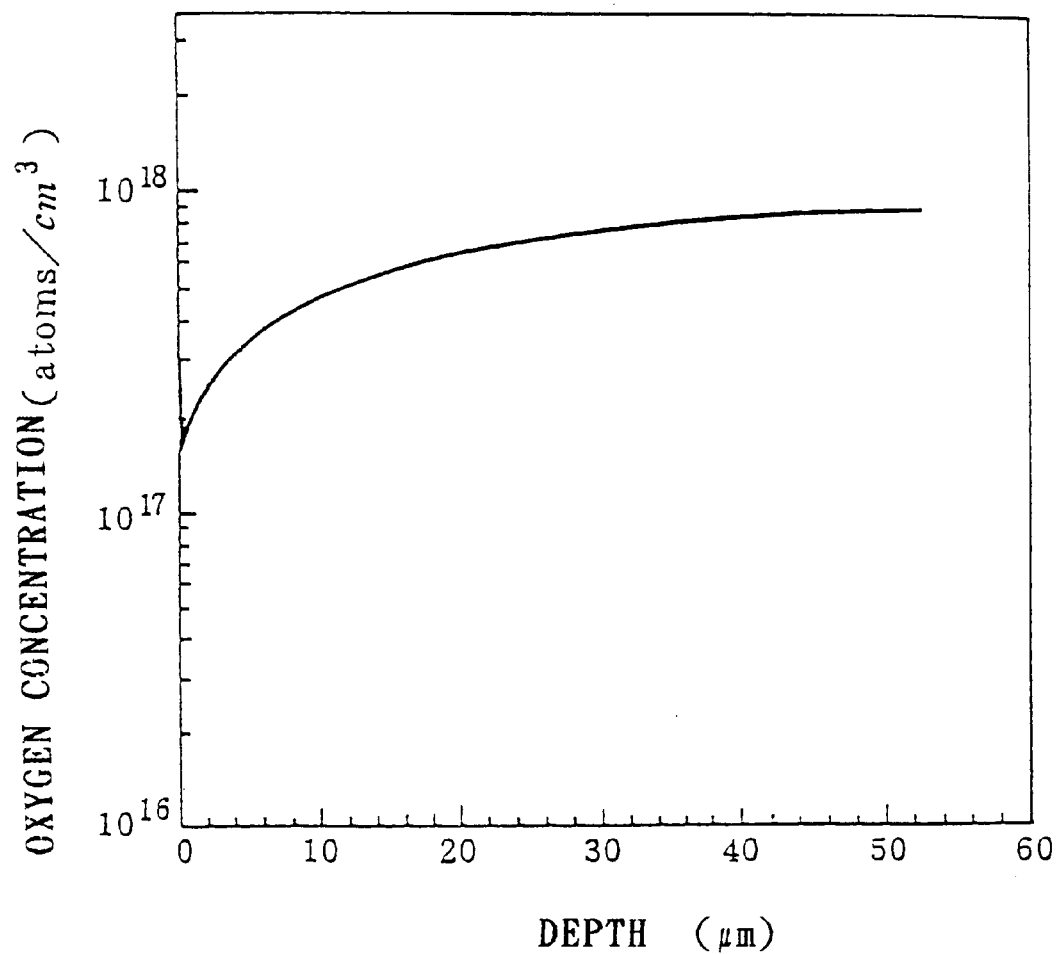
FIG. 12 is a graph depicting the relationship between depth from wafer surface and oxygen concentration.

After annealing, SIMS was used to measure the oxygen concentrations in all the wafers in a certain group, and in the fourth and eighth wafers of the other groups from the surface layers of the wafers inward (depth-wise). The results indicated that DZ layers had been secured in all wafers. FIG. 11 and FIG. 12 depict graphs indicating the relationship between surface depth and oxygen concentration based on the results of oxygen concentration measurements in the fourth and eighth wafers, respectively, from the top of a certain wafer group.

It was learned that annealing via the present invention, whereby a plurality of wafers are stacked together, and a plurality of wafer groups are stacked up and loaded into an annealing boat, makes it possible to achieve uniform outward diffusion of oxygen in each and every simultaneously processed wafer. And the progress of this outward diffusion of oxygen is a function of annealing temperature and time.

Embodiment 3

Figure 13A:
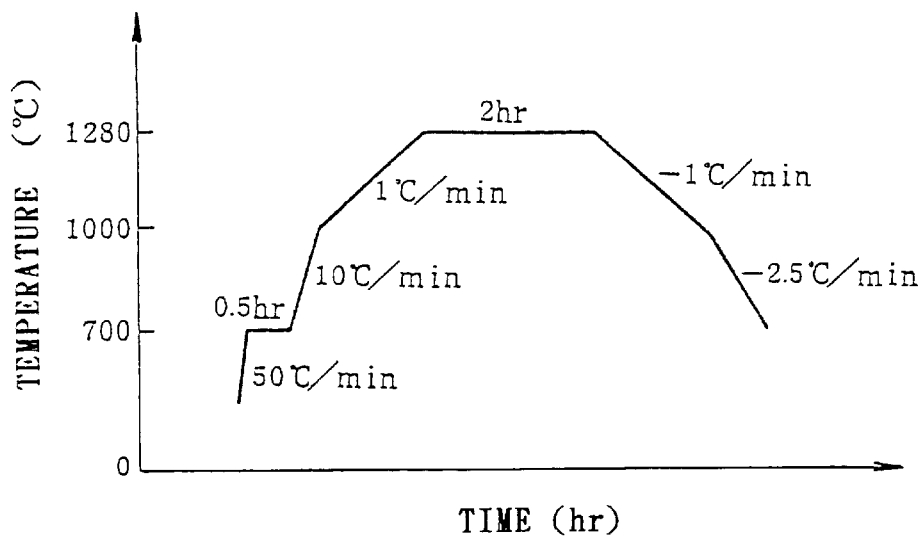
FIG. 13A and B depict heat pattern diagrams showing examples of annealing conditions.

Boron-doped wafers measuring 8-inches in diameter and having an oxygen concentration of 14~15×10$^{17}$ atoms/cm$^3$ (old ASTM) were piled up into stacks of 10, and were annealed in the same furnace as that used in Embodiment 1 using the heat pattern depicted in FIG. 13A. In addition, annealing was also carried out using the heat pattern depicted in FIG. 13B.

The heat pattern depicted in FIG. 13A indicates annealing whereby ramp up to 700° C. is at a rate of 50° C./min, then, after maintaining 700° C. for 30 minutes, the temperature is increased to 1,000° C. at a ramp rate of 10° C./min, and then raised to 1,280° C. at a ramp rate of 1° C./min. After maintaining a temperature of 1,280° C. for two hours, the temperature is lowered to 1,000° C. at a ramp rate of 1° C./min, and then ramped down to 700° C. at a rate of 2.5° C./min.

Figure 13B:
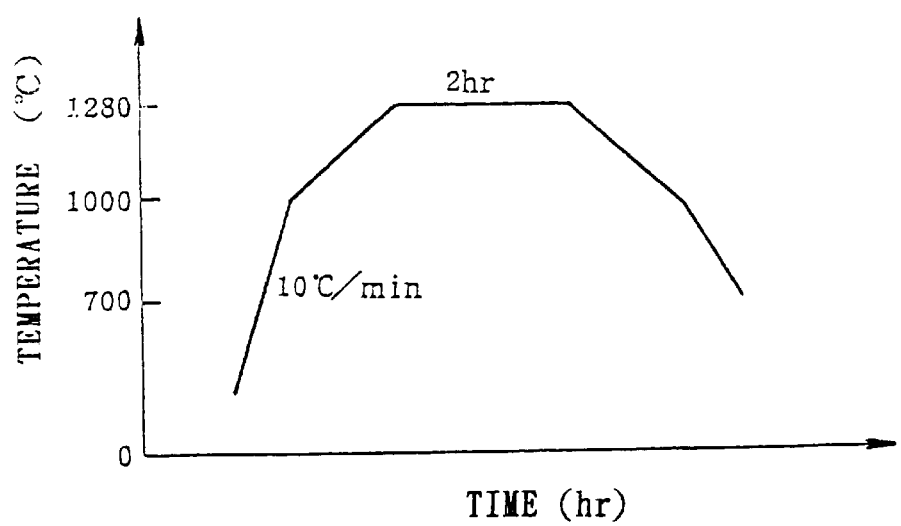

The heat pattern depicted in FIG. 13B indicates annealing whereby the temperature is increased from room temperature to 1,000° C. at a ramp rate of 10° C./min, then raised to 1,280° C. at a ramp rate of 1° C./min, and after maintaining a temperature of 1,280° C. for two hours, the temperature is lowered to 1,000° C. at a ramp rate of 1° C./min, and then ramped down to 700° C. at a rate of 2.5° C./min.

Following the two types of annealing, both sets of wafers were subjected to evaluation annealing at 1,000° C.×16 hours. After that, the wafers were cleaved and preferential etched. The amount of silicon etched off at this time was roughly a depth of 2 μm from surface. Next, the oxygen precipitate density of cross-sections of wafers was measured using an optical microscope.

As a result of observing wafer cross-sections through an optical microscope, it was learned the sample wafers annealed as indicated in FIG. 13B exhibited no oxygen precipitates, and the sample wafers annealed as indicated in FIG. 13A had formed DZ layers to a depth of 30 μm from the wafer surface, but in regions deeper than that, oxygen precipitates of around $10^5$~$10^6$/cm$^2$ had grown. Also, since the wafers produced via the heat pattern depicted in FIG. 13B cannot be expected to exhibit the IG effect, the EG effect may be furnished thereafter by depositing a layer of polysilicon.

Embodiment 4

Similar to Embodiment 1, etched 8-inch diameter silicon single crystal wafers were stacked into groups of 10 wafers, a plurality of steps (groups) were loaded into an annealing boat and annealed at 1,280° C.×one hour. This annealing was performed in a number of environments, including an argon gas environment, a 100% dry $O_2$ environment, a 100% $N_2$ environment, and a 3% $O_2/N_2$ environment. The same annealing was also carried out in each of the above-described environments using silicon single crystal wafers that had undergone mirror polishing.

The peripheries of wafers annealed in an argon gas environment exhibited localized adhesion, but there was absolutely no adhesion observed among stacked wafers annealed in other environments.

Embodiment 5

A silicon ingot grown via the CZ process with an oxygen concentration of 12.5~15×10$^{17}$ atoms/cm$^3$ (old ASTM) was ground into a cylindrical shape, following which it was sliced into wafers, the surfaces of which were then etched with either an aqueous solution comprising a hydrofluoric/nitric acid mixture or a KOH solution, and after that, the silicon single crystal wafers were subjected to SC-1 and SC-2 cleaning. Then, using the previously-described annealing boat depicted in FIG. 1, 10 of these silicon single crystal wafers were stacked into a group, and by vertically stacking up 30 of these groups in sequence, 300 wafers were loaded into the boat.

This annealing boat was loaded into a cylindrical annealing furnace pre-heated to 700° C., the furnace was ramped up to 1,000° C. at a rate of 8° C./min, and then up to 1,280° C. at a rate of 1° C./min, the temperature was maintained at 1,280° C. for two hours, following which it was ramped down to 1,000° C. at a rate of 1° C./min, then down to 700° C. at a rate of 2.5° C./min., and the annealing boat was withdrawn from the annealing furnace. The environment inside the furnace comprised 5%$O_2$-95%Ar.

After using a horizontal furnace to carry out precipitation annealing at 600° C. ×four hours or 700° C. ×four hours on the sample wafers that had undergone the above-described annealing, the wafers were then subjected to evaluation annealing at 1,000° C. ×16 hours. Following that, the wafers were cleaved and preferential etched. Roughly 2 μm of silicon surface were removed during etching at this time. Next, the oxygen precipitate density (BMD density) of cross-sections of wafers was measured using an optical microscope.

Figure 14:
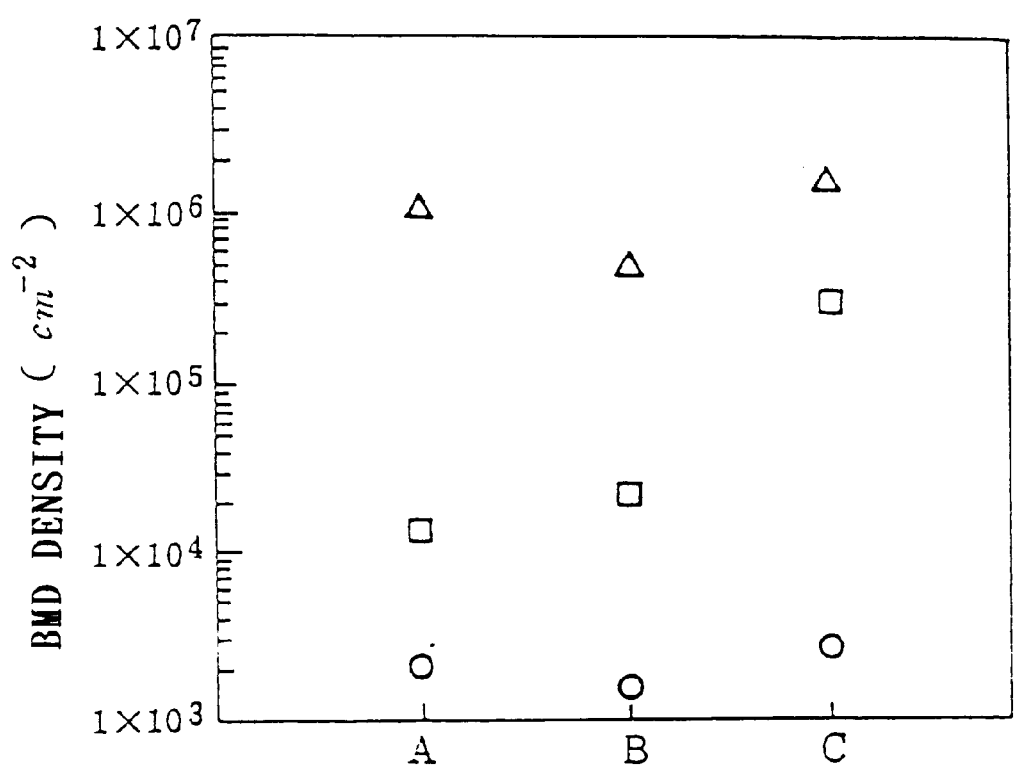
FIG. 14 is a graph depicting the relationship between differences in oxygen concentration and BMD density in wafers for which annealing was performed using the annealing method of the present invention. In this figure, A depicts a low-oxygen concentration wafer with an initial oxygen concentration of $12.5 \sim 13 \times 10^{17}$ atoms/cm$^3$, B depicts a medium oxygen concentration wafer with an initial oxygen concentration of $13.5 \sim 14 \times 10^{17}$ atoms/cm$^3$, and C depicts a high oxygen concentration wafer with an initial oxygen concentration of $14.5 \sim 15 \times 10^{17}$ atoms/cm$^3$.
Figure 15:
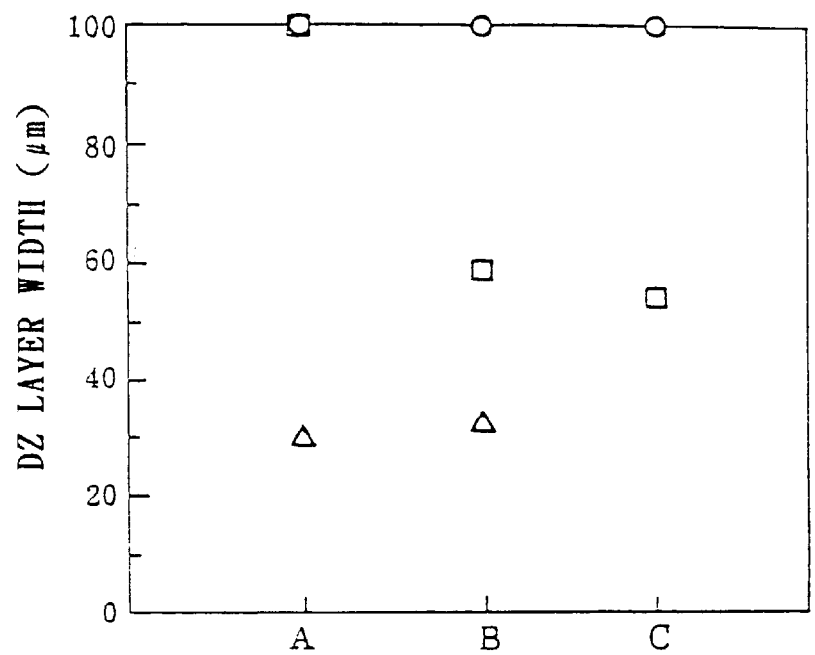
FIG. 15 is a graph depicting the relationship between differences in oxygen concentration and DZ layer width in wafers for which annealing was performed using the annealing method of the present invention.

In FIG. 14 and FIG. 15, Group A depicts a low-oxygen concentration wafer with an initial oxygen concentration of 12.5~13×10$^{17}$ atoms/cm$^3$, Group B depicts a medium oxygen concentration wafer with an initial oxygen concentration of 13.5~14×10$^{17}$ atoms/cm$^3$, and Group C depicts a high oxygen concentration wafer with an initial oxygen concentration of 14.5~15×10$^{17}$ atoms/cm$^3$, with circles indicating wafers annealed in stacks, triangles indicating wafers subjected to precipitation annealing at 600° C.×four hours, and squares indicating wafers subjected to precipitation annealing at 700° C. ×four hours. As depicted in FIG. 15, all the sample wafers exhibited DZ layers at depths of 30 μm or deeper, and as depicted in FIG. 14, it is possible to ensure BMD density of over 1×10$^5$ cm$^2$ in the bulk by combining initial oxygen concentrations with post annealing temperatures.

Further, it was also learned that annealing sample wafers with low oxygen concentrations at 600° C. resulted in higher precipitate density than annealing them at 700° C. Therefore, it could be determined that the oxygen precipitation processing temperature is a function of the initial oxygen concentration of a wafer, and that temperatures ranging from 500° C. to 900° C. can be applied.

Embodiment 6

A silicon ingot grown via the CZ process and having an oxygen concentration of 12.5~15×10$^{17}$ atoms/cm$^3$ (old ASTM) was ground into a cylindrical shape, following which it was sliced into wafers, and the surfaces of these silicon single crystal wafers were then etched with an aqueous solution comprising a hydrofluoric/nitric acid mixture. Then, using the previously-described annealing boat depicted in FIG. 1, 10 of these silicon single crystal wafers were stacked into a group, and by vertically stacking up 30 of these groups in sequence, 300 wafers were loaded into the boat.

This annealing boat was loaded into a vertical annealing furnace pre-heated to 700° C., the furnace was ramped up to 1,000° C. at a rate of 10° C./min, and then up to 1,280° C. at a rate of 1° C./min, the temperature was maintained at 1,280° C. for two hours, following which it was ramped down to 1,000° C. at a rate of 1° C./min, then down to 700° C. at a rate of 2.5° C./min, and the annealing boat was withdrawn from the annealing furnace. The environment inside the furnace comprised 5%$O_2$-95%$N_2$.

After annealing, mirror polishing was performed to remove roughly a depth of 10μm from the surface of each wafer, and after repeated RCA SC-1 cleaning, a laser surface inspection machine (Tencor Instruments SurfScan 6200) was used to measure light point defect (LPD) with grain diameters of over 0.12 μm. AFM observation of LPD was also performed for a portion of the wafers. Cleaning and measurement operations were also performed for wafers that did not undergo the above-described annealing of the present invention.

Figure 16:
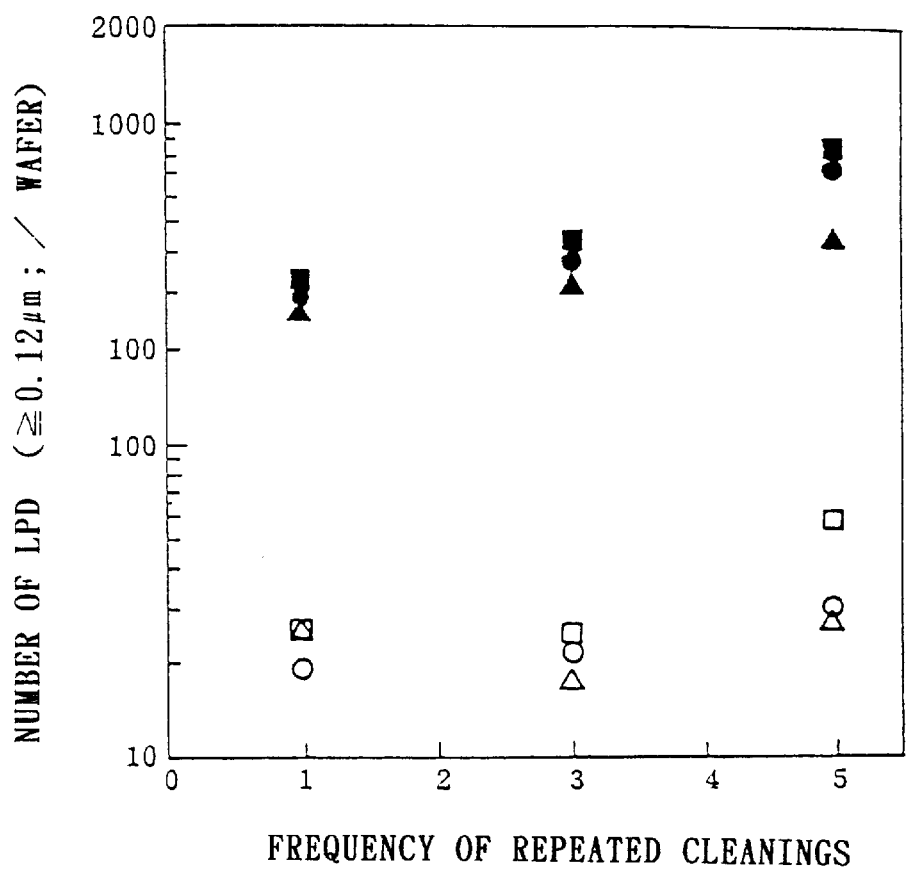
FIG. 16 is a graph depicting the relationship between the frequency of repeated (SC-1) cleanings and the number of LPD.
Figure 17A:
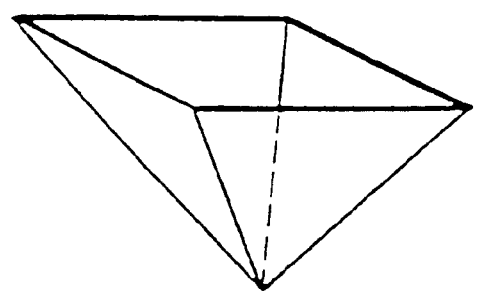
FIG. 17A is an oblique view drawn from an atomic force microscope (AFM) image of a wafer surface COP defect.
Figure 17B:
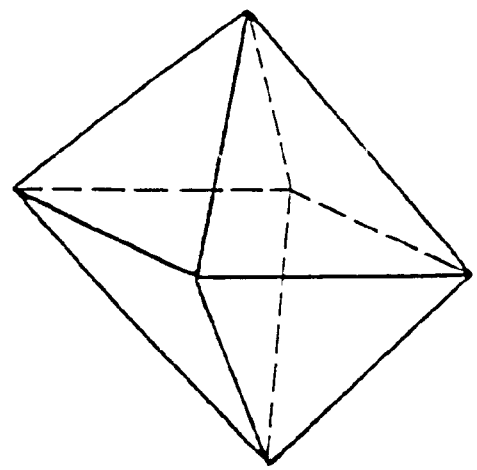
FIG. 17B is an oblique view of a defect inferred from the drawing in A, comprising a polyhedron shape that has an octahedron as its basic structure, and which is hollow inside.
Figure 18:
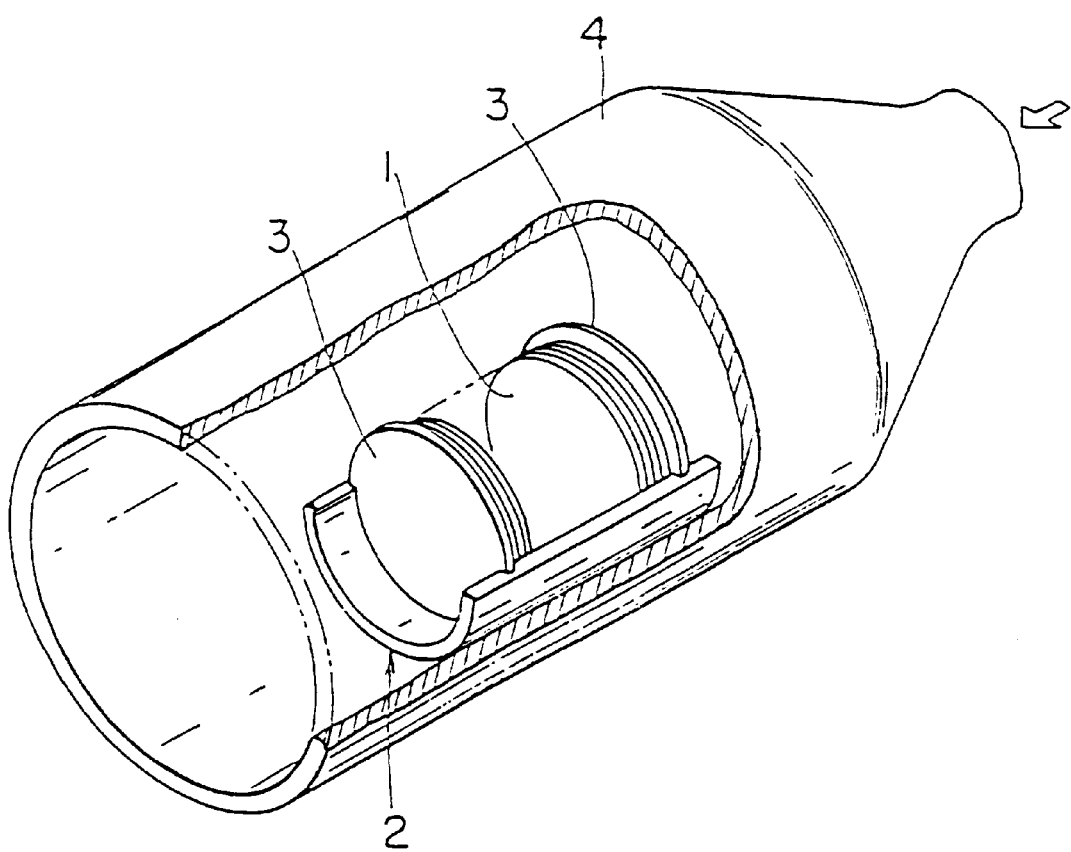
FIG. 18 is a partially exposed oblique view of a rough configuration of conventional silicon single crystal wafer annealing equipment.

FIG. 16 depicts the results of LPD observations after repeated SC-1 cleaning. The circles depict a low-oxygen concentration wafer with an initial oxygen concentration of $12.5 \times 10^{17}$ atoms/$cm^3$, the triangles depict a medium oxygen concentration wafer with an initial oxygen concentration of $13.5 \times 10^{17}$ atoms/$cm^3$, and the squares depict a high oxygen concentration wafer with an initial oxygen concentration of $14.5 \times 10^{17}$ atoms/$cm^3$. The blackened circles, triangles and squares, respectively, depict low-, medium- and high-oxygen concentration wafers, which did not undergo annealing via the present invention.

Wafers that did not undergo annealing via the present invention exhibited around 300 LPD within the wafer surface after just one cleaning, and it was determined that repeated SC-1 cleaning greatly increased the number of LPD. However, it was ascertained that wafers which were subjected to annealing via the present invention exhibited a greatly reduced number of LPD, and further, it was learned that the number of LPD only increased slightly after repeated SC-1 cleaning.

To clarify the natural shape of this LPD, shape observations were carried out using an AFM. It was ascertained that all LPD exhibited by wafers annealed via the present invention were particles; the wafers were COP free.

Embodiment 7

The conditions, whereby wafers were annealed at 1,280° C. for two hours in Embodiment 6, were changed to 1,280° C.×fours hours, and 1,300° C.×two hours, and similarly annealed sample wafers were checked for COP abundance ratio using the same method employed in Embodiment 6. As a result, it was ascertained that COP were completely eliminated from wafers subjected to the two types of annealing described above. Therefore, it was possible to confirm that stacked-wafer annealing via the present invention is effective at greatly reducing COP when a high temperature of 1,280° C. is sustained for more than two hours.

Industrial Applicability

The annealing method of the present invention calls for stacking up around 10 wafers, treating this group as a unit, placing this group, either horizontally or slightly inclined at an angle of roughly 0.5~5°, into a boat, which makes contact with and supports the periphery of the wafers at a plurality of locations, and stacking up a plurality of these groups of wafers into numerous stacks inside the boat. As indicated in the embodiments, this method enables a variety of annealing to be applied to silicon single crystal wafers, making it possible to prevent dislocation and slip, and to provide the same annealing effect uniformly to all wafers.

The present invention performs annealing by stacking up a large number of wafers, and makes it possible to completely prevent the generation of dislocation and slip by placing a dummy wafer at the bottom of a stack of wafers. And since it also enables the manufacturing process to be designed so that annealing either can be performed on wafers that have not undergone finishing mirror polishing, or can be performed in an environment which forms a protective surface layer, with mirror polishing being carried out after annealing, yields are not reduced by stacked wafers adhering to one another.

In particular, the annealing method of the present invention makes it possible to simultaneously perform the same type of annealing on all the wafers sliced from the same silicon single crystal ingot, thereby preventing the spread of overall dislocation and slip brought on by the conventional so-called ingot annealing process, and enabling the enhancement of silicon single crystal wafer yield.

Further, the annealing method of the present invention calls for annealing at a sustained temperature in excess of 1,100° C., and, during the ramp up process, by increasing the temperature from 500° C. to 900° C. at a predetermined ramp rate, during which time that temperature may or may not be maintained at a fixed temperature, and during the ramp down process following sustained heating at a temperature in excess of 1,100° C., by lowering the temperature so that the above-mentioned fixed temperature may or may not be maintained, it is possible to simultaneously form defect-free regions (DZ layers) and to furnish IG functions via the formation of BMD to a large volume of wafers, and to efficiently complete annealing of a large volume of wafers in a short period of time.

Furthermore, the annealing method of the present invention is advantageous in that it enables a large volume of wafers to be simultaneously maintained at a temperature between 1,280° C.~1,380° C., for example, and makes it possible to reduce or eliminate surface layer and internal COP during annealing, thereby enabling stable supplies of high-quality wafers.

We claim:

1. Silicon single crystal wafer annealing equipment comprising (1) at least three vertical support plates having at vertical intervals a plurality of protrudent portions or concave portions, each portion being constructed and arranged to contact a periphery of a wafer and (2) support holders to support the wafer on a horizontal or inclined plane at the protrudent portions or concave portions of the support plates, wherein a plurality of wafers are stacked in touching relationship one on top of another as a group and are loaded as a group onto a set of said support holders to enable loaded wafer groups to be simultaneously heated.

2. Silicon single crystal wafer annealing equipment as claimed in claim 1, wherein when a support holder of said support holders supports the wafer on an inclined plane, said annealing equipment further comprises a buffer layer made of a material having resistance to a high temperature, said buffer layer being arranged on the support plate positioned at a lower end of said inclined plane.

3. Silicon single crystal wafer annealing equipment comprising (1) a cylinder and (2) a plurality of ring-shaped or disc-shaped support holders arranged horizontally at vertical intervals on an inner peripheral surface of said cylinder and in the axial direction thereof, each support holder being constructed and arranged to contact a peripheral edge of a wafer, wherein a plurality of wafers are stacked in touching relationship one on top of another as a group and are loaded as a group onto a set of said support holders to enable loaded wafer groups to be simultaneously heated.

4. Silicon single crystal wafer annealing equipment comprising (1) a cylinder, (2) a plurality of ring-shaped or disc-shaped support holders arranged horizontally on an inner peripheral surface of said cylinder, each support holder being constructed and arranged to contact a peripheral edge of a wafer, (3) a jig, on which a plurality of layered wafers in touching relationship are loaded vertically and (4) cylindrical boat units, each boat unit having on one side of an outer peripheral surface a groove for guiding said jig into said boat unit, wherein said boat units, in which a plurality of layered wafers are accommodated, are stacked vertically to enable the layered wafers to be heated simultaneously.

* * * * *